(12) United States Patent
Tsuda (10) Patent No.: US 10,389,085 B2
(45) Date of Patent: Aug. 20, 2019

(54) METHOD OF MANUFACTURING LIGHT EMITTING DEVICE

(71) Applicant: Sodick Co., Ltd., Kanagawa (JP)

(72) Inventor: Yuki Tsuda, Kanagawa (JP)

(73) Assignee: Sodick Co., Ltd., Kanagawa (JP)

( * ) Notice: Subject to any disclaimer, the term of this patent is extended or adjusted under 35 U.S.C. 154(b) by 0 days.

(21) Appl. No.: 16/120,319

(22) Filed: Sep. 3, 2018

(65) Prior Publication Data

US 2019/0097384 A1 Mar. 28, 2019

(30) Foreign Application Priority Data

Sep. 22, 2017 (JP) ................................. 2017-182689

(51) Int. Cl.

| H01L 33/00 | (2010.01) |
|---|---|
| H01S 5/30 | (2006.01) |
| H01S 5/024 | (2006.01) |
| H01S 5/042 | (2006.01) |
| H01S 5/02 | (2006.01) |

(Continued)

(52) U.S. Cl.
CPC .............. *H01S 5/024* (2013.01); *H01L 21/02* (2013.01); *H01L 33/0054* (2013.01); *H01L 33/16* (2013.01); *H01L 33/18* (2013.01); *H01L 33/343* (2013.01); *H01L 33/382* (2013.01); *H01S 5/021* (2013.01); *H01S 5/0425* (2013.01);

(Continued)

(58) Field of Classification Search
CPC ... H01L 33/005; H01L 33/0054; H01L 33/16; H01L 33/18; H01L 33/343; H01L 33/382; H01S 5/024; H01S 5/021; H01S 5/3054; H01S 5/0425

See application file for complete search history.

(56) References Cited

U.S. PATENT DOCUMENTS 7,809,039 B2 * 10/2010 Yamamoto ............. B82Y 20/00
372/43.01
9,000,679 B2 * 4/2015 Tsuda ................. H05B 33/0815
315/291

(Continued)

FOREIGN PATENT DOCUMENTS

JP 2012243824 12/2012

OTHER PUBLICATIONS

Tadashi Kawazoe et al., "Polarization control of an infrared silicon light-emitting diode by dressed photons and analyses of the spatial distribution of doped boron atoms", Applied Physics A, vol. 121, Issue 4, Jun. 25, 2015, pp. 1409-1415.

*Primary Examiner* — Savitri Mulpuri
(74) *Attorney, Agent, or Firm* — JCIPRNET (57) ABSTRACT

Shown is a method of manufacturing a light emitting device capable of efficiently heating a device at the time of DPP annealing and suppressing heat generation of the device at the time of driving. In the method of manufacturing the light emitting device, a first p-type electrode is formed on a low-concentration portion having a low p-type dopant concentration formed under a first region of the p-type semiconductor portion, a second p-type electrode is formed on a high-concentration portion having a high p-type dopant concentration formed under a second region of the p-type semiconductor portion, and a predetermined forward bias voltage is applied between the first p-type electrode and a first n-type electrode formed on an n-type semiconductor portion at the time of DPP annealing.

3 Claims, 6 Drawing Sheets

(51) Int. Cl.
| | |
|---|---|
| *H01L 33/18* | (2010.01) |
| *H01L 33/34* | (2010.01) |
| *H01L 33/16* | (2010.01) |
| *H01L 33/38* | (2010.01) |
| *H01L 21/02* | (2006.01) |
| *H01S 5/32* | (2006.01) |
| *H01S 5/20* | (2006.01) |

(52) U.S. Cl.
CPC .......... *H01S 5/3224* (2013.01); *H01S 5/2068* (2013.01); *H01S 5/305* (2013.01); *H01S 5/3054* (2013.01)

(56) References Cited

U.S. PATENT DOCUMENTS

| | | | | |
|---|---|---|---|---|
| 9,337,395 | B2* | 5/2016 | Kalem | ................ H01L 29/7831 |
| 2013/0009193 | A1* | 1/2013 | Ohtsu | ................ C23C 14/3435 |
| | | | | 257/99 |

* cited by examiner

METHOD OF MANUFACTURING LIGHT EMITTING DEVICE

CROSS-REFERENCE TO RELATED APPLICATION

This application claims the priority benefit of Japan application serial no. 2017-182689, filed on Sep. 22, 2017. The entirety of the above-mentioned patent applications is hereby incorporated by reference herein and made a part of this specification.

BACKGROUND

Field of the Invention

The disclosure relates to a method of manufacturing a light emitting device used in a silicon semiconductor laser.

Description of Related Art

As a device used for an indirect transition-type semiconductor laser, there is one described in Patent Document 1. This device is formed of an indirect transition-type semiconductor such as silicon and includes a p-type semiconductor portion having a high p-type dopant concentration with respect to an n-type dopant concentration, an n-type semiconductor portion having a high n-type dopant concentration with respect to a p-type dopant concentration, and a pn junction portion formed at a boundary portion between the p-type semiconductor portion and the n-type semiconductor portion.

In order to cause such a device formed of an indirect transition-type semiconductor to emit light, it is necessary to form an array of p-type dopants and n-type dopants for light emission of the pn junction portion inside the pn junction portion of the device. In Patent Document 1, after the device is formed, a predetermined bias voltage is applied in a forward direction so that the side of p-type semiconductor portion has a positive voltage and the side of n-type semiconductor portion has a negative voltage to cause a current to flow in the pn junction portion. Due to the heat generated thereby, p-type dopants and n-type dopants in the pn junction portion are diffused and a dopant distribution is repeatedly changed, and population inversion occurs between a conduction band and a valence band in the pn junction portion due to the bias voltage. Therefore, when electrons in the conduction band forming the population inversion are induced and emitted, the current flowing in the pn junction portion is decreased and a temperature of the device is lowered, and thereby distribution of the p-type dopants and n-type dopants in the pn junction portion is fixed (hereinafter referred to as DPP (Dressed Photon Phonon)annealing).

In addition, Non-Patent Document 1 describes a silicon semiconductor device having the same configuration as the device described in Patent Document 1. Also, a concentration distribution of p-type dopants of the p-type semiconductor portion of the device is described. More specifically, the p-type dopant concentration of the p-type semiconductor portion peaks at a depth of about 1.5 m from a surface of the device, and a peak concentration thereof is about $1 \times 10^{19}$ particles/cm$^3$. In addition, the p-type semiconductor portion is formed by ion-implanting p-type dopants into a surface of a device in which n-type dopants are uniformly diffused.

Figure 6:
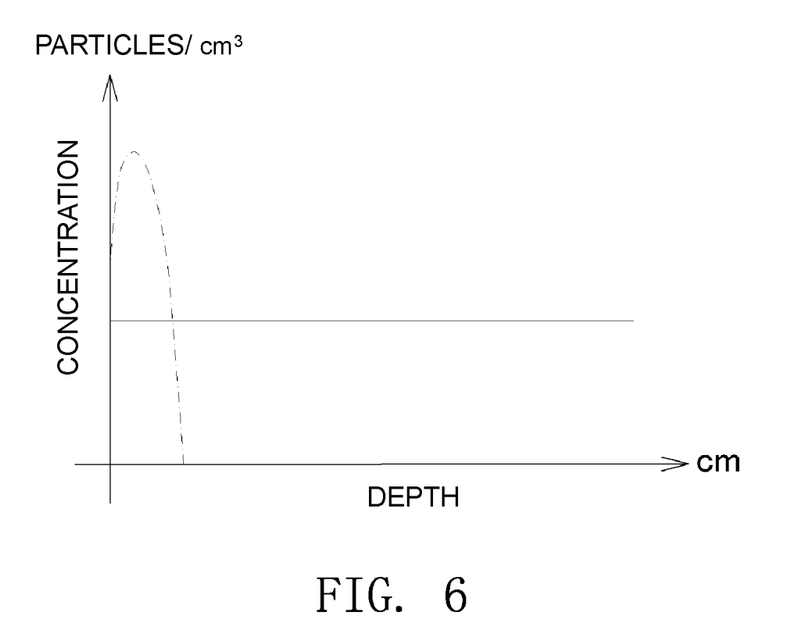
FIG. 6 is a graph showing correlations between a depth, a p-type dopant concentration, and an n-type dopant concentration of the silicon semiconductor device described in Non-Patent Document 1.

FIG. 6 illustrates a correlation between a depth and dopant concentrations of the device described in Non-Patent Document 1. In FIG. 6, the p-type dopant concentration with respect to a depth of the device is indicated by a single dotted-dashed line, and the n-type dopant concentration with respect to a depth of the device is indicated by a solid line. Further, a "depth" of a device is set on the basis of one end surface into which p-type dopants are implanted and to deepen toward the other end surface.

As illustrated in FIG. 6, in the device described in Non-Patent Document 1, the n-type dopant concentration is constant irrespective of the depth of the device and is suppressed at a low value. In addition, in a region having a shallow depth, the p-type dopant concentration is higher than the n-type dopant concentration, and its peak value is about $1 \times 10^{19}$ particles/cm$^3$.

That is, the region having a shallow depth in FIG. 6 indicates distribution of a dopant concentration of the p-type semiconductor portion of the device described in Non-Patent Document 1. Further, the region having a deep depth indicates distribution of a dopant concentration of the n-type semiconductor portion. Thus, a region in which a difference between the p-type dopant concentration and the n-type dopant concentration is small indicates distribution of dopant concentrations of the pn junction portion.

[Patent Document 1] Japanese Laid-Open No. 2012-243824
[Non-Patent Document 1] Tadashi Kawazoe 1, Katsuhiro Nishioka, Motoichi Ohtsu, "Polarization control of an infrared silicon light-emitting diode by dressed photons and analyses of the spatial distribution of doped boron atoms," Applied Physics A, issued on Jun. 25, 2015, p. 1409 to 1415

Here, in general, p-type dopants added by ion implantation have a low fixation rate in the vicinity of a surface of the device. Therefore, as illustrated in FIG. 6, the dopant concentration in the vicinity of the surface on a side on which ion-implantation is performed is remarkably low as compared with the above-described peak value, and the vicinity of the surface has high resistance. In addition, the device described in Non-Patent Document 1 is designed such that the n-type dopant concentration diffused into the entire device is low, and the n-type semiconductor portion has high resistance. Accordingly, since both the side of p-type semiconductor portion and the side of n-type semiconductor portion to which a voltage is applied have high resistance in the vicinity of the surfaces, the device can be effectively heated and p-type dopants and n-type dopants in the pn junction portion can be actively diffused at the time of DPP annealing.

However, at the time of driving, since the high resistance portion becomes a source of heat generation, the device is heated when the device is used for a long time, which causes malfunction or failures.

The disclosure has been made in view of the above circumstances and further provides a method of manufacturing a light emitting device capable of efficiently heating a device at the time of DPP annealing and suppressing heat generation of the device at the time of driving.

SUMMARY

A method of manufacturing a light emitting device according to the invention includes a device formation process of forming a device in which boron is ion-implanted in a concentration range of $1 \times 10^{19}$ particles/cm$^3$ or more and $1 \times 10^{21}$ particles/cm$^3$ or less into one surface in a thickness direction of a substrate formed of single-crystal silicon in which n-type dopants consisted of one or more of arsenic and antimony are uniformly diffused in a concentration range of $1 \times 10^{14}$ particles/cm$^3$ or more and $1 \times 10^{16}$ particles/ cm³ or less so that a p-type semiconductor portion in which diffusion is made to have a higher p-type dopant concentration than an n-type dopant concentration is formed on one surface side, an n-type semiconductor portion in which n-type dopants are diffused is formed on the other surface side facing the one surface, and a pn junction portion is formed at a boundary portion between the p-type semiconductor portion and the n-type semiconductor portion, a first low resistance portion formation process of polishing a second region excluding a first region on the one surface or ion-implanting p-type dopants into the second region so that a p-type dopant concentration of the p-type semiconductor portion under the second region is $1\times10^{19}$ particles/cm³ or more, a first electrode formation process of forming a first p-type electrode in the first region, a second p-type electrode independent from the first p-type electrode in the second region, and a first n-type electrode on the other surface, and a DPP annealing process of repeatedly changing distribution of dopants by diffusing p-type dopants and n-type dopants inside the pn junction portion with heat generated when a predetermined forward bias voltage is applied to the first p-type electrode and the first n-type electrode so that the side of p-type semiconductor portion has a positive voltage and the side of n-type semiconductor portion has a negative voltage to cause a current to flow in the pn junction portion, and decreasing the current flowing in the pn junction portion and reducing a temperature thereof to fix distribution of p-type dopants and n-type dopants inside the pn junction portion by causing a population inversion between a conduction band and a valence band to occur in the pn junction portion to induce and emit electrons in the conduction band forming the population inversion.

A method of manufacturing a light emitting device according to the invention includes a device formation process of forming a device in which boron is ion-implanted in a concentration range of $1\times10^{19}$ particles/cm³ or more and $1\times10^{21}$ particles/cm³ or less into one surface in a thickness direction of a substrate formed of single-crystal silicon in which n-type dopants consisting of one or more of arsenic and antimony are uniformly diffused in a concentration range of $1\times10^{14}$ particles/cm³ or more and $1\times10^{21}$ particles/cm³ or less so that a p-type semiconductor portion in which diffusion is made to have a higher p-type dopant concentration than an n-type dopant concentration is formed on one surface side, an n-type semiconductor portion in which n-type dopants are diffused is formed on the other surface side facing the one surface, and a pn junction portion in which n-type dopants and p-type dopants are mixed and diffused is formed at a boundary portion between the p-type semiconductor portion and the n-type semiconductor portion, a third electrode formation process of forming a third p-type electrode on the one surface and forming a third n-type electrode on the other surface, a DPP annealing process of repeatedly changing distribution of dopants by diffusing p-type dopants and n-type dopants inside the pn junction portion with heat generated when a predetermined forward bias voltage is applied to the third p-type electrode and the third n-type electrode so that the side of p-type semiconductor portion has a positive voltage and the side of n-type semiconductor side has a negative voltage to cause a current to flow in the pn junction portion, and decreasing the current flowing in the pn junction portion and reducing a temperature thereof to fix distribution of p-type dopants and n-type dopants inside the pn junction portion by causing a population inversion between a conduction band and a valence band to occur in the pn junction portion to induce and emit electrons in the conduction band forming the population inversion, a second electrode removing process of removing the third p-type electrode, a third low resistance portion formation process of polishing the one surface or ion-implanting p-type dopants into the one surface so that a p-type dopant concentration of the p-type semiconductor portion is $1\times10^{19}$ particles/cm³ or more, and a fourth electrode formation process of re-forming a fourth p-type electrode on the one surface.

DESCRIPTION OF THE EMBODIMENTS

In the disclosure, in the first low resistance portion formation process before the DPP annealing process, the second region excluding the first region on one surface is polished, or p-type dopants are ion-implanted into the second region so that a p-type dopant concentration of the p-type semiconductor portion under the second region is $1\times10^{19}$ particles/cm³ or more. That is, in one surface, a p-type dopant concentration under the second region is increased while a p-type dopant concentration under the first region is maintained at a low concentration. In addition, an n-type dopant concentration diffused into the entire device is set low, and thus the n-type dopant concentration in the n-type semiconductor portion on the other surface side is low. Therefore, at the time of DPP annealing, by applying a voltage between the first p-type electrode formed in the first region on one surface and the first n-type electrode formed on the other surface, the entire device can be efficiently heated. Further, at the time of driving, by applying a voltage between the second p-type electrode formed in the second region and the first n-type electrode formed on the other surface, heat generation on one surface side can be suppressed.

According to the method of manufacturing a light emitting device according to the invention, the invention further includes a first electrode removing process of removing the first n-type electrode after the DPP annealing process, a second low resistance portion formation process of adding n-type dopants so that an n-type dopant concentration of the n-type semiconductor portion is $1\times10^{19}$ particles/cm³ or more, and a second electrode formation process of re-forming a second n-type electrode on the other surface.

In the disclosure, in the second low resistance portion formation process before driving, an n-type dopant concentration of the n-type semiconductor portion is set to $1\times10^{19}$ particles/cm³ or more by ion-implanting n-type dopants.

That is, an n-type dopant concentration under the other surface is increased. Thus, since a concentration under the other surface can be increased in addition to the concentration under the second region of one surface which has already been increased, it is possible to suppress heat generation on both the one surface side and the other surface side, and heat generation of the entire device can be suppressed at the time of driving.

According to the method of manufacturing a light emitting device of the invention, the invention provides that in the second low resistance portion formation process, the n-type semiconductor portion is polished as thin as possible within a range in which formation of the pn junction portion is possible and the n-type dopants are ion-implanted into the other surface so that the n-type dopant concentration of the n-type semiconductor portion is $1\times10^{19}$ particles/cm$^3$ or more.

In the disclosure, in the second low resistance portion formation process, the n-type semiconductor portion is polished as thin as possible within a range in which the pn junction portion can be formed and the n-type dopants are ion-implanted into the other surface so that the n-type dopant concentration of the n-type semiconductor portion is $1\times10^{19}$ particles/cm$^3$ or more. Thereby, a volume of the device can be suppressed to the minimum, and heat generation during driving can be suppressed to the utmost.

In the disclosure, the vicinity of one surface has a low p-type dopant concentration without fixation of p-type dopants. In addition, an n-type dopant concentration diffused into the entire device is set low, and thus the n-type dopant concentration in the n-type semiconductor portion on the other surface side is low. Therefore, by applying a voltage between the third p-type electrode formed on one surface and the third n-type electrode formed on the other surface, the entire device can be efficiently heated. Further, in the third low resistance portion formation process after the DPP annealing process, by polishing one surface or ion-implanting p-type dopants into one surface, the p-type dopant concentration of the p-type semiconductor portion is $1\times10^{19}$ particles/cm$^3$ or more. That is, the p-type dopant concentration under one surface is increased. Thereby, heat generation on one surface side at the time of driving can be suppressed.

According to the method of manufacturing a light emitting device according to the invention, the invention further includes a third electrode removing process of removing the third n-type electrode after the DPP annealing process, a fourth low resistance portion formation process of adding n-type dopants so that an n-type dopant concentration of the n-type semiconductor portion is $1\times10^{19}$ particles/cm$^3$ or more, and a fifth electrode formation process of re-forming the third n-type electrode on the other surface.

In the disclosure, in the fourth low resistance portion formation process before driving, n-type dopants are ion-implanted so that the n-type dopant concentration of the n-type semiconductor portion is $1\times10^{19}$ particles/cm$^3$ or more. That is, the n-type dopant concentration under the other surface is increased. Thus, since a concentration under the other surface can be increased in addition to the concentration under one surface which has already been increased, it is possible to suppress heat generation on both the one surface side and the other surface side, and heat generation of the entire device can be suppressed during driving.

According to the method of manufacturing a light emitting device of the invention, the invention provides that in the fourth low resistance portion formation process, the n-type semiconductor portion is polished as thin as possible within a range in which formation of the pn junction portion is possible and the n-type dopants are ion-implanted into the other surface so that the n-type dopant concentration of the n-type semiconductor portion is $1\times10^{19}$ particles/cm$^3$ or more.

In the disclosure, in the fourth low resistance portion formation process, the n-type semiconductor portion is polished as thin as possible within a range in which the pn junction portion can be formed and n-type dopants are ion-implanted into the other surface so that the n-type dopant concentration of the n-type semiconductor portion is $1\times10^{19}$ particles/cm$^3$ or more. Thereby, a volume of the device can be suppressed to the minimum, and heat generation during driving can be suppressed to the utmost.

According to the method of manufacturing a light emitting device of the invention, the n-type dopants and the p-type dopants in the light emitting device are reversely configured.

In the disclosure, the n-type dopants and the p-type dopants in the light emitting device are reversely configured. Therefore, the disclosure can be applied even when the n-type dopants and the p-type dopants are reversed.

According to the disclosure, it is possible to efficiently heat the device at the time of DPP annealing and suppress heat generation of the device at the time of driving.

Figure 1:
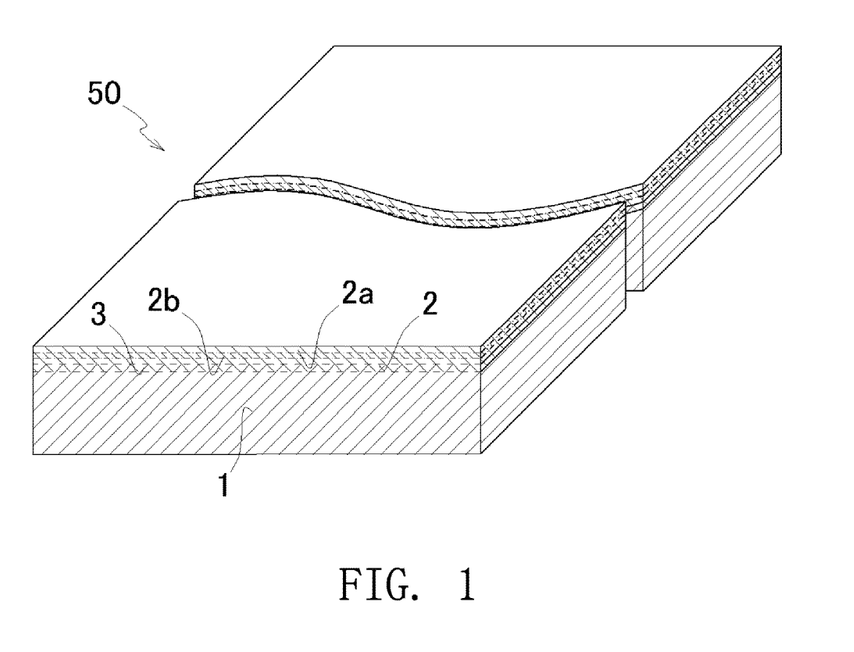
FIG. 1 is a perspective view of a device before processing according to the present embodiment.

Hereinafter, embodiments of the disclosure will be described with reference to the drawings As illustrated in FIG. 1, a device 50 before processing is prepared by ion-implanting p-type dopants into an upper surface of a substrate formed of single-crystal silicon in which n-type dopants have been uniformly diffused at a low concentration. The device 50 is formed of an n-type semiconductor portion 1 in which n-type dopants are diffused, a p-type semiconductor portion 2 in which p-type dopants are diffused so that a p-type dopant concentration is higher than an n-type dopant concentration, and a pn junction portion 3 formed at a boundary portion between the n-type semiconductor portion 1 and the p-type semiconductor portion 2.

The n-type semiconductor portion 1 is formed on a lower surface side of the device 50. In the n-type semiconductor portion 1, n-type dopants are evenly diffused in a concentration range of $1\times10^{14}$ particles/cm$^3$ or more and $1\times10^{16}$ particles/cm$^3$ or less. The n-type dopants are formed of, for example, at least one of arsenic and antimony.

The p-type semiconductor portion 2 is formed on an upper surface side of the device 50. In the p-type semiconductor portion 2, p-type dopants are diffused so that a peak value of the p-type dopant concentration is in a concentration range of $1\times10^{19}$ particles/cm$^3$ or more and $1\times10^{21}$ particles/cm$^3$ or less. Here, the p-type dopants added by ion-implantation have a low fixation rate in the vicinity of a surface of the device 50. Accordingly, in the p-type semiconductor portion 2, a low-concentration portion 2a having a low p-type dopant concentration is formed in the vicinity of an upper surface of the ion-implanted device 50 and a high-concentration portion 2b in which p-type dopants are diffused to have the above-described concentration range at a peak value is formed under the low-concentration portion 2a. The p-type dopant may be, for example, formed of boron.

Next, a method of manufacturing light emitting devices 100, 200, 300, and 400 by processing the above-described device 50 will be described in detail with reference to FIGS. 2 to 5.

First Embodiment

Figure 2A:
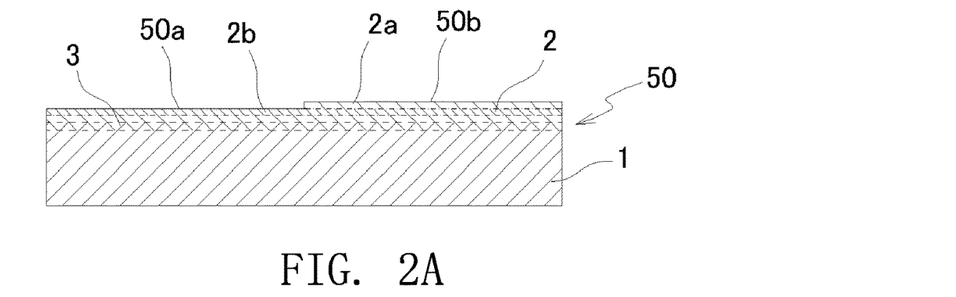
FIG. 2A to FIG. 2D are a view illustrating a manufacturing procedure of a light emitting device according to a first embodiment.

As illustrated in FIG. 2A, a region 50a on a substantially half on the left side of an upper surface of a device 50 is polished and a low-concentration portion 2a of a p-type semiconductor portion 2 is removed, thereby exposing a high-concentration portion 2b.

Figure 2B:
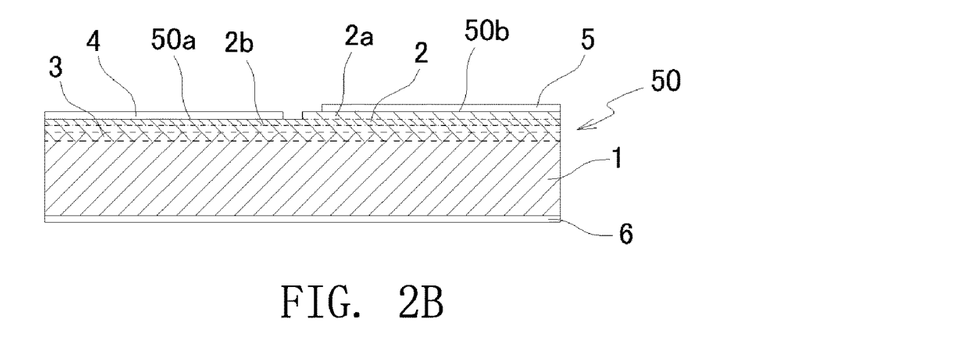

As illustrated in FIG. 2B, a p-type electrode 4 is formed on the region 50a, and a p-type electrode 5 is formed on a region 50b on a substantially half on the right side of the upper surface of the device 50 not to interfere with the p-type electrode 4. Thereby, independent p-type electrodes 4 and 5 are respectively formed on the high-concentration portion 2b having a high p-type dopant concentration and the low-concentration portion 2a having a low p-type dopant concentration. Further, an n-type electrode 6 is formed on a lower surface of the device 50. Thereby, the n-type electrode 6 is formed on the n-type semiconductor portion 1 having a low n-type dopant concentration.

A voltage is applied between the p-type electrode 5 and the n-type electrode 6 to perform DPP annealing.

Figure 2C:
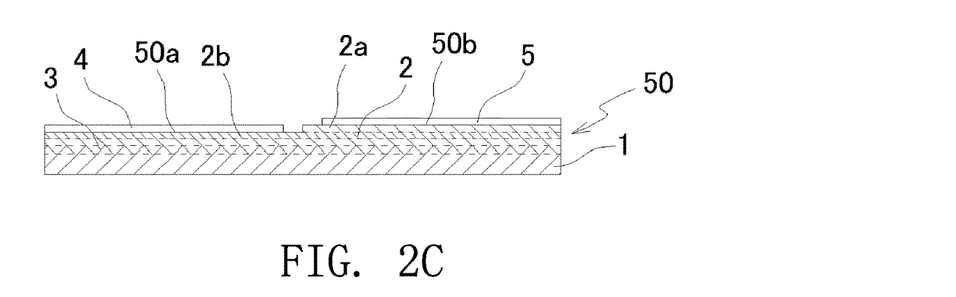

As illustrated in FIG. 2C, the n-type electrode 6 is removed, and the n-type semiconductor portion 1 is polished so that a thickness thereof is substantially equal to a thickness of the p-type semiconductor portion 2 under the region 50a.

Figure 2D:
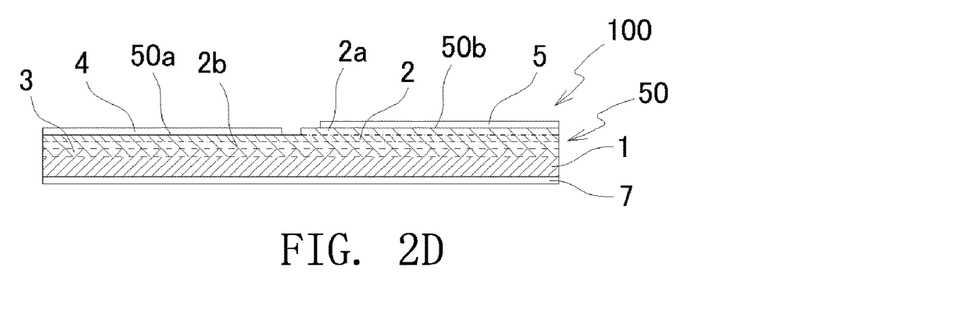

As illustrated in FIG. 2D, n-type dopants are ion-implanted into the lower surface of the device 50 so that the n-type dopant concentration of the n-type semiconductor portion 1 is in a concentration range of $1 \times 10^{19}$ particles/cm$^3$ or more. Thereafter, an n-type electrode 7 is formed on the lower surface of the device 50. Thereby, the n-type electrode 7 is formed on the n-type semiconductor portion 1 having a high n-type dopant concentration. Further, the n-type dopants implanted into the lower surface of the device 50 need not be arsenic or antimony.

The light emitting device 100 is manufactured as described above. Further, at the time of driving the light emitting device 100, a voltage is applied between the p-type electrode 4 and the n-type electrode 7.

Operations and Effects

In the present embodiment, at the time of DPP annealing, a voltage is applied between the p-type electrode 5 formed on the low-concentration portion 2a having a low p-type dopant concentration and the n-type electrode 6 formed on the n-type semiconductor portion 1 having a low n-type dopant concentration. Thereby, the entire device 50 can be efficiently heated from both the upper surface side and the lower surface side. In addition, at the time of driving, a voltage is applied between the p-type electrode 4 formed on the high-concentration portion 2b having a high p-type dopant concentration and the n-type electrode 7 formed on the n-type semiconductor portion 1 in which the n-type dopant concentration is increased. Thereby, heat generation on the upper surface side and the lower surface side can be suppressed, and heat generation of the entire device 50 can be suppressed.

Further, after the DPP annealing, the n-type semiconductor portion 1 is polished to have a thickness that is substantially equal to the thickness of the p-type semiconductor portion 2 under the region 50a. Therefore, since a volume of the device 50 is suppressed to a minimum, heat generation during driving can be suppressed to the utmost.

Second Embodiment

Figure 3A:
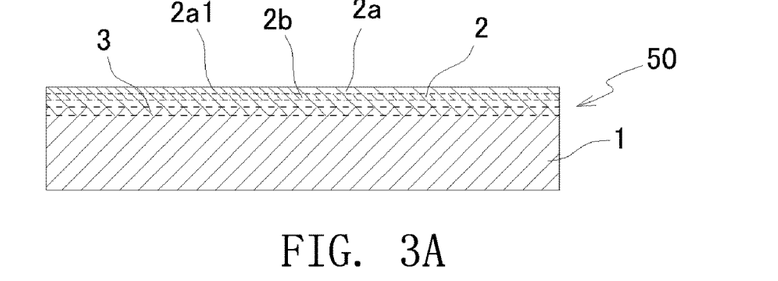
FIG. 3A to FIG. 3D are a view illustrating a manufacturing procedure of a light emitting device according to a second embodiment.

As illustrated in FIG. 3A, p-type dopants are ion-implanted into a region 50a on a substantially half on the left side of an upper surface of a device 50 to form an ion implantation portion 2al in which a p-type dopant concentration on a substantially half on the left side of a low-concentration portion 2a is $1 \times 10^{19}$ particles/cm$^3$ or more. Further, the p-type dopants implanted into the region 50a on the substantially half on the left side of the upper surface of the device 50 need not be boron.

Figure 3B:
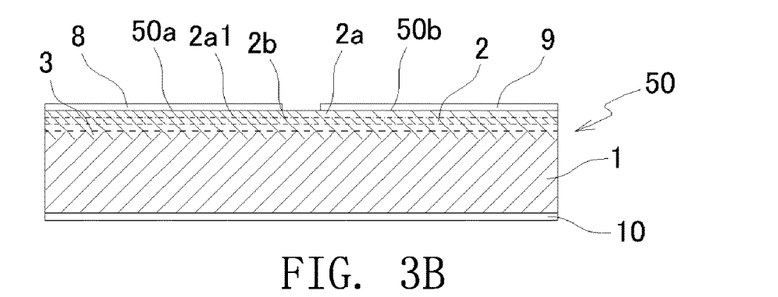

As illustrated in FIG. 3B, a p-type electrode 8 is formed on the region 50a, and a p-type electrode 9 is formed on a region 50b on a substantially half on the right side of the upper surface of the device 50 so as not to interfere with the p-type electrode 4. Thereby, the independent p-type electrodes 8 and 9 are respectively formed on the ion implantation portion 2al having a high p-type dopant concentration and the low-concentration portion 2a having a low p-type dopant concentration. Further, an n-type electrode 10 is formed on a lower surface of the device 50. Thereby, the n-type electrode 10 is formed on an n-type semiconductor portion 1 having a low n-type dopant concentration.

A voltage is applied between the p-type electrode 9 and the n-type electrode 10 to perform DPP annealing.

Figure 3C:
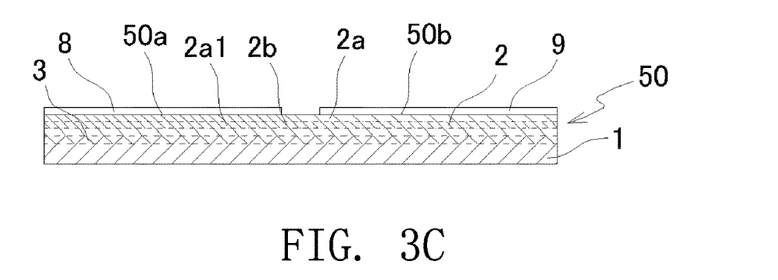

As illustrated in FIG. 3C, the n-type electrode 10 is removed, and the n-type semiconductor portion 1 is polished so that a thickness thereof is substantially equal to a thickness of the p-type semiconductor portion 2.

Figure 3D:
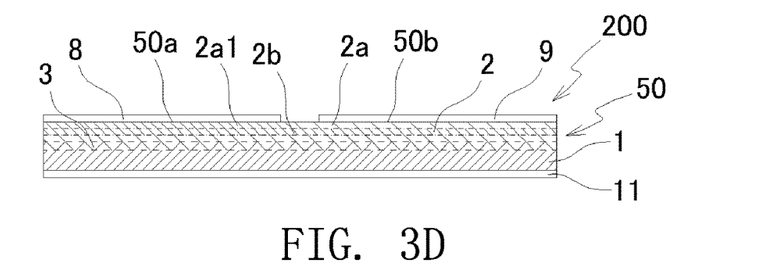

As illustrated in FIG. 3D, n-type dopants are ion-implanted into the lower surface of the device 50 so that the n-type dopant concentration of the n-type semiconductor portion 1 is in a concentration range of $1 \times 10^{19}$ particles/cm$^3$ or more. Thereafter, an n-type electrode 11 is formed on the lower surface of the device 50. Thereby, the n-type electrode 11 is formed on the n-type semiconductor portion 1 having a high n-type dopant concentration. Further, the n-type dopants implanted into the lower surface of the device 50 need not be arsenic or antimony.

The light emitting device 200 is manufactured as described above. Further, at the time of driving the light emitting device 200, a voltage is applied between the p-type electrode 8 and the n-type electrode 11.

Operations and Effects

In the present embodiment, at the time of the DPP annealing, a voltage is applied between the p-type electrode 9 formed on the low-concentration portion 2a having a low p-type dopant concentration and the n-type electrode 10 formed on the n-type semiconductor portion 1 having a low n-type dopant concentration. Thereby, the entire device 50 can be efficiently heated from both the upper surface side and the lower surface side. In addition, at the time of driving, a voltage is applied between the p-type electrode 8 formed on the ion implantation portion 2al having a high p-type dopant concentration and the n-type electrode 11 formed on the n-type semiconductor portion 1 in which the n-type dopant concentration is increased. Thereby, heat generation on the upper surface side and the lower surface side can be suppressed, and heat generation of the entire device 50 can be suppressed.

Further, after the DPP annealing, the n-type semiconductor portion 1 is polished to have a thickness that is substantially equal to the thickness of the p-type semiconductor portion 2 under the region 50a. Therefore, since a volume of the device 50 is suppressed to a minimum, heat generation during driving can be suppressed to the utmost.

Third Embodiment

Figure 4A:
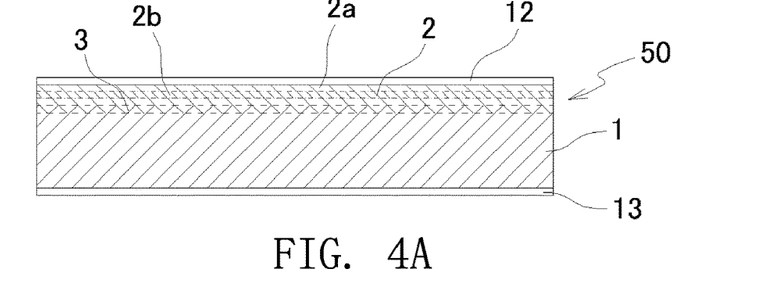
FIG. 4A to FIG. 4E are a view illustrating a manufacturing procedure of a light emitting device according to a third embodiment.

As illustrated in FIG. 4A, a p-type electrode 12 is formed on an upper surface of a device 50. Thereby, the p-type electrode 12 is formed on a low-concentration portion 2a having a low p-type dopant concentration. Further, an n-type electrode 13 is formed on a lower surface of the device 50. Thereby, the n-type electrode 13 is formed on the n-type semiconductor portion 1 having a low n-type dopant concentration.

A voltage is applied between the p-type electrode 12 and the n-type electrode 13 to perform DPP annealing.

Figure 4B:
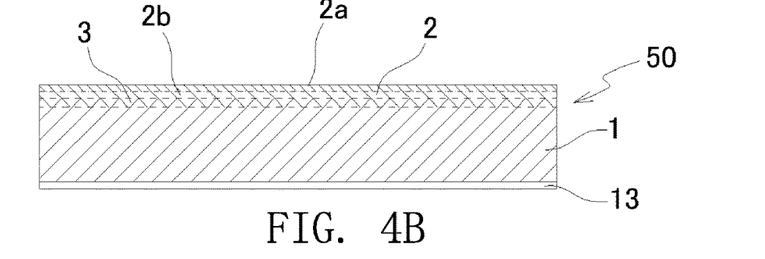
Figure 4C:
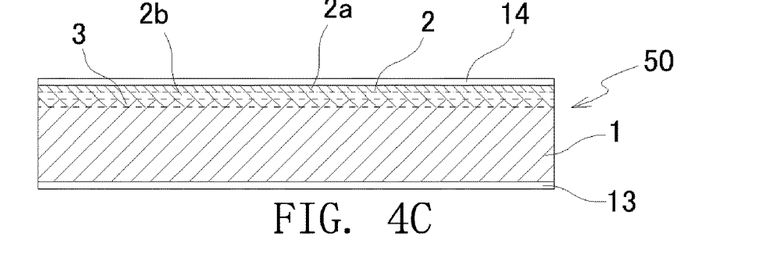

As illustrated in FIG. 4B, the p-type electrode 12 is removed and an upper surface of the device 50 is polished to remove the low-concentration portion 2a of a p-type semiconductor portion 2, thereby exposing a high-concentration portion 2b. Thereafter, as illustrated in FIG. 4C, a p-type electrode 14 is formed on the upper surface of the device 50. Thereby, the p-type electrode 14 is formed on the high-concentration portion 2b having a high p-type dopant concentration.

Figure 4D:
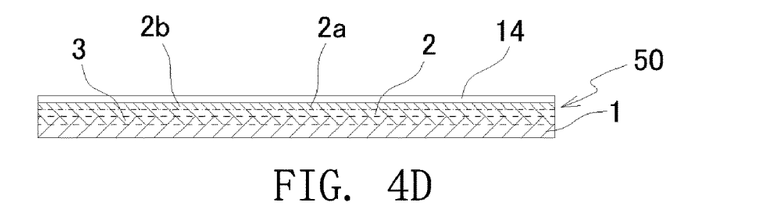

As illustrated in FIG. 4D, the n-type electrode 13 is removed, and the n-type semiconductor portion 1 is polished so that a thickness thereof is substantially equal to a thickness of the p-type semiconductor portion 2.

Figure 4E:
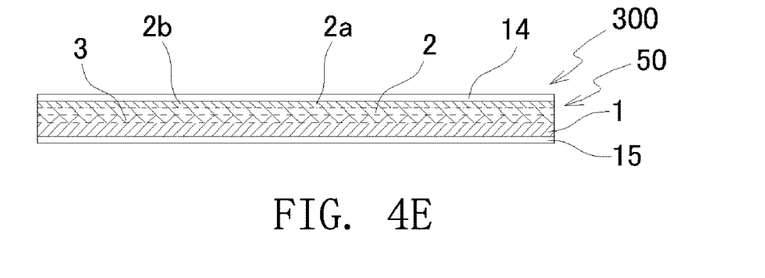

As illustrated in FIG. 4E, ion implantation is performed on the lower surface of the device 50 so that the n-type dopant concentration of the n-type semiconductor portion 1 is in a concentration range of $1 \times 10^{19}$ particles/cm$^3$ or more. Thereafter, an n-type electrode 15 is formed on the lower surface of the device 50. Thereby, the n-type electrode 15 is formed on the n-type semiconductor portion 1 having a high n-type dopant concentration. Further, the n-type dopants implanted into the lower surface of the device 50 need not be arsenic or antimony.

As described above, the light emitting device 300 is manufactured. Further, at the time of driving the light emitting device 300, a voltage is applied between the p-type electrode 14 and the n-type electrode 15.

Operations and Effects

In the present embodiment, at the time of DPP annealing, a voltage is applied between the p-type electrode 12 formed on the low-concentration portion 2a having a low p-type dopant concentration and the n-type electrode 13 formed on the n-type semiconductor portion 1 having a low n-type dopant concentration. Thereby, the entire device 50 can be efficiently heated from both the upper surface side and the lower surface side. In addition, at the time of driving, a voltage is applied between the p-type electrode 14 formed on the high-concentration portion 2b having a high p-type dopant concentration and the n-type electrode 15 formed on the n-type semiconductor portion 1 in which the n-type dopant concentration is increased. Thereby, heat generation on the upper surface side and the lower surface side can be suppressed, and heat generation of the entire device 50 can be suppressed.

Further, after the DPP annealing, the n-type semiconductor portion 1 is polished to have a thickness that is substantially equal to the thickness of the p-type semiconductor portion 2 under the region 50a. Therefore, since a volume of the device 50 is suppressed to a minimum, heat generation during driving can be suppressed to the utmost.

Fourth Embodiment

Figure 5A:
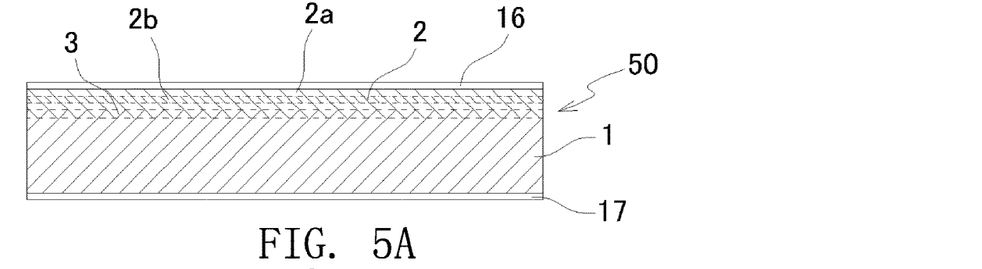
FIG. 5A to FIG. 5E are a view illustrating a manufacturing procedure of a light emitting device according to a fourth embodiment.

As illustrated in FIG. 5A, a p-type electrode 16 is formed on an upper surface of a device 50. Thereby, the p-type electrode 16 is formed on a low-concentration portion 2a having a low p-type dopant concentration. Further, an n-type electrode 17 is formed on a lower surface of the device 50. Thereby, the n-type electrode 17 is formed on the n-type semiconductor portion 1 having a low n-type dopant concentration.

A voltage is applied between the p-type electrode 16 and the n-type electrode 17 to perform DPP annealing.

Figure 5B:
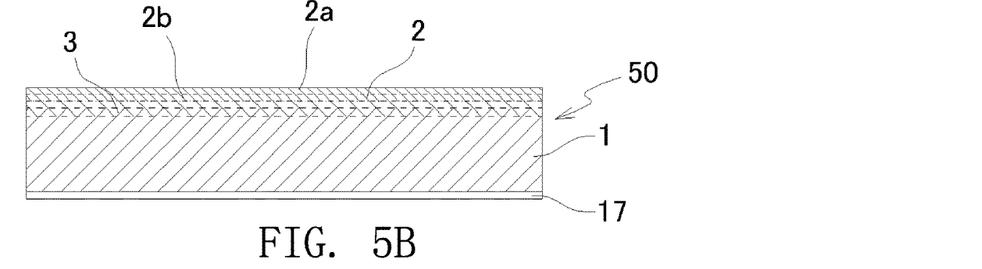
Figure 5C:
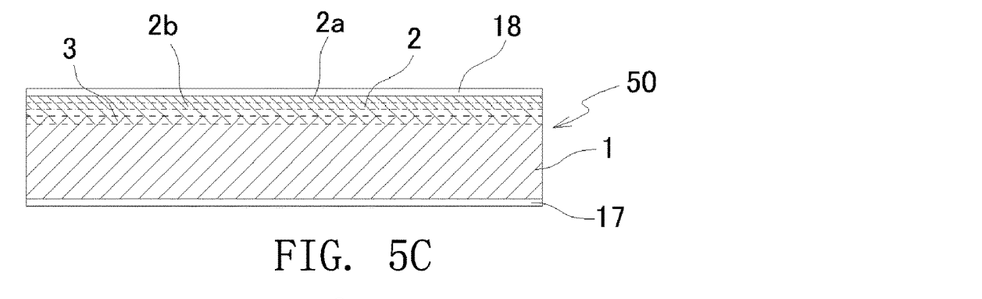

As illustrated in FIG. 5B, the p-type electrode 16 is removed and p-type dopants are ion-implanted into the upper surface of the device 50 so that the p-type dopant concentration of the low-concentration portion 2a is in a concentration range of $1 \times 10^{19}$ particles/cm$^3$ or more. Thereafter, as illustrated in FIG. 5C, a p-type electrode 18 is formed on the upper surface of the device 50. Further, the p-type dopants implanted into the upper surface of the device 50 need not be boron.

Figure 5D:
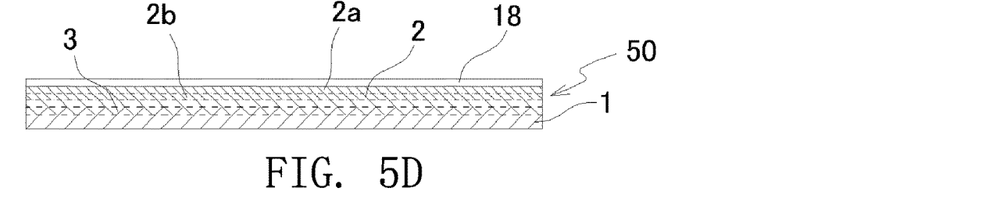

As illustrated in FIG. 5D, the n-type electrode 17 is removed, and the n-type semiconductor portion 1 is polished so that a thickness thereof is substantially equal to a thickness of the p-type semiconductor portion 2.

Figure 5E:
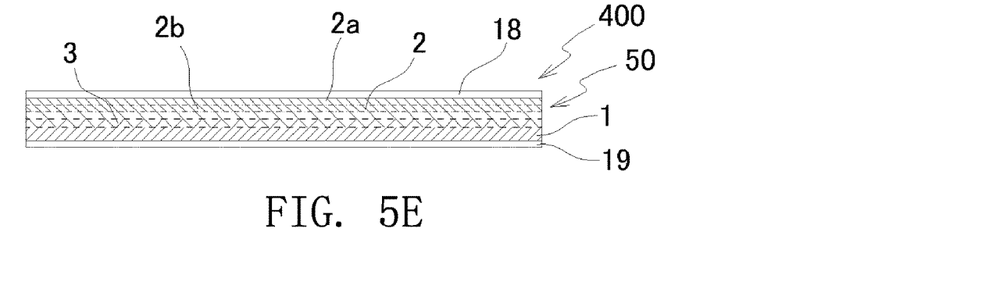

As illustrated in FIG. 5E, ion implantation is performed on the lower surface of the device 50 so that the n-type dopant concentration of the n-type semiconductor portion 1 is in a concentration range of $1 \times 10^{19}$ particles/cm$^3$ or more. Thereafter, an n-type electrode 19 is formed on the lower surface of the device 50. Thereby, the n-type electrode 19 is formed on the n-type semiconductor portion 1 having a high n-type dopant concentration. Further, the n-type dopants implanted into the lower surface of the device 50 need not be arsenic or antimony.

As described above, the light emitting device 400 is manufactured. Further, at the time of driving the light emitting device 400, a voltage is applied between the p-type electrode 18 and the n-type electrode 19.

Operations and Effects

In the present embodiment, at the time of DPP annealing, a voltage is applied between the p-type electrode 16 formed on the low-concentration portion 2a having a low p-type dopant concentration and the n-type electrode 17 formed on the n-type semiconductor portion 1 having a low n-type dopant concentration. Thereby, the entire device 50 can be efficiently heated from both an upper surface side and a lower surface side. In addition, at the time of driving, a voltage is applied between the p-type electrode 18 formed on the low-concentration portion 2a in which the p-type dopant concentration is increased and the n-type electrode 19 formed on the n-type semiconductor portion 1 in which the n-type dopant concentration is increased. Thereby, heat generation on the upper surface side and the lower surface side can be suppressed, and heat generation of the entire device 50 can be suppressed.

Further, after the DPP annealing, the n-type semiconductor portion 1 is polished to have a thickness that is substantially equal to the thickness of the p-type semiconductor portion 2 under the region 50a. Therefore, since a volume of the device 50 is suppressed to a minimum, heat generation during driving can be suppressed to the utmost.

The disclosure is not limited to the embodiments and examples described above, and various design modifications are possible within the scope of the described claims.

In the present embodiment, the left half of the upper surface of the device 50 is set as the region 50a, and the right half is set as the region 50b, and the p-type electrodes 4, 5, 8, and 9 are formed, however, the regions 50a and 50b may be set in any way. For example, the regions 50a and 50b may be formed in a comb shape and the p-type electrodes 4, 5, 8, and 9 formed along the regions 50a and 50b may be alternately arranged in a uniaxial direction.

Further, the thickness of the n-type semiconductor portion 1 after polishing may have any value as long as it is within a range in which the pn junction portion 3 can be formed.

Also, after DPP annealing, polishing of the n-type semiconductor portion 1 and increasing of the concentration thereof need not be performed. In this case, heat generation on the p-type semiconductor side at the time of driving can be suppressed.

Further, both the n-type dopants and the p-type dopants may be reversely configured.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A method of manufacturing a light emitting device comprising:
    a device formation process of forming a device in which boron is ion-implanted in a concentration range of $1 \times 10^{19}$ particles/cm$^3$ or more and $1 \times 10^{21}$ particles/cm$^3$ or less into one surface in a thickness direction of a substrate formed of single-crystal silicon in which n-type dopants consisting of one or more of arsenic and antimony are uniformly diffused in a concentration range of $1 \times 10^{14}$ particles/cm$^3$ or more and $1 \times 10^{16}$ particles/cm$^3$ or less so that a p-type semiconductor portion in which diffusion is made to have a higher p-type dopant concentration than an n-type dopant concentration is formed on the one surface side, an n-type semiconductor portion in which n-type dopants are diffused is formed on the other surface side facing the one surface, and a pn junction portion is formed at a boundary portion between the p-type semiconductor portion and the n-type semiconductor portion;
    a first low resistance portion formation process of polishing a second region excluding a first region on the one surface or ion-implanting p-type dopants into the second region so that a p-type dopant concentration of the p-type semiconductor portion under the second region is $1 \times 10^{19}$ particles/cm$^3$ or more;
    a first electrode formation process of forming a first p-type electrode in the first region, a second p-type electrode independent from the first p-type electrode in the second region, and a first n-type electrode on the other surface; and
    a DPP annealing process of repeatedly changing distribution of dopants by diffusing p-type dopants and n-type dopants inside the pn junction portion with heat generated when a predetermined forward bias voltage is applied to the first p-type electrode and the first n-type electrode so that the side of p-type semiconductor portion has a positive voltage and the side of n-type semiconductor portion has a negative voltage to cause a current to flow in the pn junction portion, and decreasing the current flowing in the pn junction portion and reducing a temperature thereof to fix distribution of p-type dopants and n-type dopants inside the pn junction portion by causing a population inversion between a conduction band and a valence band to occur in the pn junction portion to induce and emit electrons in the conduction band forming the population inversion.

2. The method of manufacturing a light emitting device according to claim 1, further comprising:
    a first electrode removing process of removing the first n-type electrode after the DPP annealing process;
    a second low resistance portion formation process of adding n-type dopants so that an n-type dopant concentration of the n-type semiconductor portion is $1 \times 10^{19}$ particles/cm$^3$ or more; and
    a second electrode formation process of re-forming a second n-type electrode on the other surface.

3. The method of manufacturing a light emitting device according to claim 2, wherein, in the second low resistance portion formation process, the n-type semiconductor portion is polished as thin as possible within a range in which formation of the pn junction portion is possible and the n-type dopants are ion-implanted into the other surface so that the n-type dopant concentration of the n-type semiconductor portion is $1 \times 10^{19}$ particles/cm$^3$ or more.

* * * * *